(12) United States Patent
Hirano

(10) Patent No.: US 7,471,112 B2
(45) Date of Patent: Dec. 30, 2008

(54) DIFFERENTIAL AMPLIFIER CIRCUIT

(75) Inventor: Ryo Hirano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/599,253

(22) Filed: Nov. 15, 2006

(65) Prior Publication Data

US 2007/0109022 A1    May 17, 2007

(30) Foreign Application Priority Data

Nov. 16, 2005    (JP) .............................. 2005-330932

(51) Int. Cl.
  *H03K 19/094* (2006.01)
(52) U.S. Cl. ........................ 326/86; 327/109
(58) Field of Classification Search ............. 326/82–83, 326/86, 93, 95, 98, 112–113; 327/108–109
See application file for complete search history.

(56) References Cited

U.S. PATENT DOCUMENTS

| | | | |
|---|---|---|---|
| 5,264,743 A | 11/1993 | Nakagome et al. | |
| 5,355,391 A * | 10/1994 | Horowitz et al. | 375/257 |
| 5,541,532 A * | 7/1996 | McCall | 326/68 |
| 5,761,124 A | 6/1998 | Sato et al. | |
| 5,978,271 A | 11/1999 | Sato et al. | |
| 6,130,556 A * | 10/2000 | Schmitt et al. | 326/81 |
| 6,232,800 B1 | 5/2001 | Hirairi | |
| 6,370,060 B2 | 4/2002 | Takata et al. | |
| 6,407,582 B1 * | 6/2002 | Chan | 326/86 |
| 6,433,586 B2 * | 8/2002 | Ooishi | 326/93 |

FOREIGN PATENT DOCUMENTS

| | | |
|---|---|---|
| JP | 05-342854 | 12/1993 |
| JP | 05-342871 | 12/1993 |
| JP | 7-105693 | 4/1995 |
| JP | 2000-082290 | 3/2000 |
| JP | 2001-185999 | 7/2001 |
| JP | 2001-307494 | 11/2001 |

* cited by examiner

*Primary Examiner*—Rexford Barnie
*Assistant Examiner*—Jason Crawford
(74) *Attorney, Agent, or Firm*—Foley & Lardner LLP

(57) ABSTRACT

A differential amplifier circuit is provided with transfer gates for interrupting input signals to control a timing of supplying the input signals and a timing of starting the differential amplifier circuit.

13 Claims, 6 Drawing Sheets

DIFFERENTIAL AMPLIFIER CIRCUIT

This application claims priority to prior Japanese patent application JP 2005-330932, the disclosure of which is incorporated herein by reference.

BACKGROUND OF THE INVENTION

This invention relates to a differential amplifier circuit and, in particular, to a differential amplifier circuit capable of preventing occurrence of noise.

Following recent development of a multi-functional high-speed electronic system apparatus, a semiconductor device is systemized and developed towards a larger scale and a higher speed with a CPU and a memory device built therein. In order to adapt the semiconductor device to a large-scale high-speed electronic system, various techniques are adopted in the semiconductor device. For example, by lowering a power supply voltage and stepping up or down the power supply voltage inside the semiconductor device as desired, power saving and a higher speed are achieved. For a higher speed, various approaches are made, for example, a reduction in signal amplitude, adoption of complementary data, and an expansion of a data bus width.

However, the reduction in signal amplitude for the purpose of a higher speed poses a new problem. When the signal amplitude is reduced, complementary signals and a differential amplifier circuit for comparing a signal potential and a reference potential are frequently used. However, such differential amplifier circuit is disadvantageous in that an operation speed is decreased and an operation error is caused to occur due to small variation in input potential resulting from noise. Referring to FIG. 1, the differential amplifier circuit will be described. The differential amplifier circuit comprises differential input transistors 1 and 2, current mirror transistors 3 and 4, current source transistors 5, 6, and 7, a pull-up transistor 12, output transfer gate transistors 13 and 14, clocked inverter circuit transistors 15, 16, 17, and 18, and a plurality of inverter circuits.

The differential input transistor 1 has a drain, a source, and a gate connected to a node N9, a differential common node N3, and an input signal terminal IN1, respectively. The differential input transistor 2 has a drain, a source, and a gate connected to a judgment output node N4, the differential common node N3, and an input signal terminal IN2, respectively. The current mirror transistor 3 has a drain, a source, and a gate connected to the node N9, a power supply potential, and the node N9, respectively. The current mirror transistor 4 has a drain, a source, and a gate connected to the judgment output node N4, the power supply potential, and the node N9, respectively. The gates of the current mirror transistors 3 and 4 are connected to the drain of the differential input transistor 1 to form the node N9. The drains of the current mirror transistor 4 and the differential input transistor 2 are connected in common to form the judgment output node N4.

The current source transistor 5 has a drain, a source, and a gate connected to the differential common node N3, a drain of the current source transistor 6, and a node N5, respectively. The current source transistor 6 has the drain, a source, and a gate connected to the source of the current source transistor 5, a drain of the current source transistor 7, and the power supply potential, respectively. The current source transistor 7 has the drain, a source, and a gate connected to the source of the current source transistor 6, a ground potential, and the power supply potential, respectively. When the current source transistor 5 is turned on and the differential common node N3 is given a low potential, input signals are subjected to differential amplification.

The pull-up transistor 12 has a drain, a source, and a gate connected to the judgment output node N4, the power supply potential, and the node N5, respectively, and pulls up the judgment output node N4 when differential amplification is not operated. The transfer gate transistor 13 has a drain, a source, and a gate connected to a node N10, a node N11, and the node N5, respectively. The transfer gate transistor 14 has a source, a drain, and a gate connected to the node N10, the node N11, and an inverted signal of the node N5, respectively. When the differential amplification is operated, an output transfer gate (13 and 14) is in a conductive state and delivers, to the node N11, a signal sent from the judgment output node N4 through the inverter circuits. During a non-operating period without carrying out the differential amplification, the output transfer gate is in an interrupted state and interrupts the signal from the judgment output node N4.

The clocked inverter circuit transistors 15, 16, 17, and 18 form a clocked inverter circuit INV19 and, in combination with one inverter INV14 in an output path, form an output latch circuit for latching output data. The clocked inverter circuit transistor 15 has a drain, a source, and a gate connected to a source of the clocked inverter circuit transistor 16, the power supply potential, and the node N5, respectively. The inverter circuit transistor 16 has a drain, the source, and a gate connected to the node N11, the drain of the clocked inverter circuit transistor 15, and a node N12, respectively. The clocked inverter circuit transistor 17 has a drain, a source, and a gate connected to the node N11, a drain of the clocked inverter circuit transistor 18, and the node N12, respectively. The clocked inverter circuit transistor 18 has the drain, a source, and a gate connected to the source of the clocked inverter circuit transistor 17, the ground potential, and an inverted signal of the node N5, respectively.

During operation of the differential amplification, the clocked inverter circuit transistors 15 and 18 are in an off state and the clocked inverter circuit has a high impedance. In this case, the output latch circuit does not carry out a latch operation. Therefore, the inverter circuit INV14 delivers data to an output side. When the differential amplification is not operated, the inverter circuit iNV14 and the clocked inverter circuit INV19 are loop-connected to form the output latch circuit which carries out the latch operation. The inverter circuits INV1 to INV18 are used to generate a control signal obtained by inverting a signal supplied thereto and to control an operation timing by delaying the control signal via connection of a plurality of stages.

In the above-mentioned differential amplifier circuit, when a start signal V1 is turned from a "H" level into a "L" level, the pull-up transistor 12 is turned off and the pull-up operation is stopped. The current supply transistor 5 is turned on and the differential common node N3 is given a low potential so that the differential amplification is started. Potentials of input signal terminals IN1 and IN2 are compared and judged and a result of comparison and judgment is reflected at the judgment output node N4. When the start signal V1 has a "H" level, the current source transistor 5 is turned off and the differential amplification is not carried out. The judgment output node N4 is given a "H" level. However, the output transfer gate is interrupted so that the output latch circuit latches a judgment output of a previous cycle and delivers the judgment output of the previous cycle to an output terminal N8.

However, when the current source transistor 5 is turned on and the differential common node N3 is dramatically lowered in potential, the potentials of the input signal terminals IN1 and IN2 are also lowered therealong due to coupling between the sources and the gates of the differential input transistors 1 and 2. At this time, due to a difference between or a state of floating capacitances (C3 and C4) of input nodes N1 and N2, variation in potential is different. Generally, wiring lengths from the input signal terminals IN1 and IN2 are different so that capacitance values C3 and C4 are different. In this case, the input nodes N1 and N2 are different in potential change. The "H" level may significantly be lowered below the "L" level of the input node on an opposite side. Due to the change in potential difference, comparison and judgment is not correctly performed so that the differential amplifier circuit causes an operation error. In particular, when the signal amplitude is small, a potential difference between two inputs is small and an operation error tends to frequently occur.

As the differential amplifier circuit started by a control signal, a sense amplifier is known. The sense amplifier is disclosed in the following patent documents. Japanese Unexamined Patent Application Publication (JP-A) No. H5-342854 (Patent Document 1) discloses an open-bit sense amplifier in which a transfer gate controls connection of bit lines to perform high-speed sensing. Japanese Unexamined PatentApplication Publications (JP-A) Nos. 2000-82290 (Patent Document 2) and H7-105693 (Patent Document 3) disclose a sense amplifier in which a transfer gate controls connection of bit lines to achieve a high-speed operation of the sense amplifier.

Japanese Unexamined Patent Application Publication (JP-A) No. H5-342871 (Patent Document 4) discloses a sense amplifier circuit in which an output of a sense amplifier is selectively delivered to a main amplifier by the use of a column switch. Japanese Unexamined PatentApplication Publication (JP-A) No. 2001-185999 (Patent Document 5) discloses a sense amplifier circuit in which a dynamic NOR circuit is provided at a preceding stage of an amplifier and produces an output for controlling a transfer gate. Japanese Unexamined Patent Application Publication (JP-A) No. 2001-307494 (Patent Document 6) discloses a semiconductor memory in which capacitance loads connected to a sense amplifier are switched and equalized by an address signal to improve an operation margin.

The above-mentioned patent documents are all related to the sense amplifier. In the patent documents 1 to 5, the transfer gate is controlled in order to remove noise from an adjacent bit line or to perform high-speed sensing by isolating a bit-line capacitance. The wiring lengths of the bit lines connected to the sense amplifier are equal to one another and wiring capacitances are equal to one another. In such sense amplifier, an input signal and an output signal are directly coupled and an input parasitic capacitance (load capacitance) is sufficiently large. Therefore, the problem addressed by this application is not posed. The patent document 6 aims to equalize the wiring capacitances in case where the number of banks is different in a ROM. The problem addressed by this invention, i.e., that the potential of the input signal is varied and a differential amplifying operation is not correctly carried out because the potential of the differential common node dramatically decreases at the start of the differential amplifying operation, is not described in these patent documents. None of the patent documents is conscious of the problem addressed by this invention and does not suggest the solution therefor.

In the semiconductor device, the signal amplitude is reduced to achieve a high-speed operation. When the signal amplitude is reduced, complementary signals and the differential amplifier circuit for comparing a signal potential and a reference potential are used. However, as described above, the differential amplifier circuit is disadvantageous in that, because the potential at the differential common node is dramatically lowered at the start of the differential amplifying operation, the potential of the input signal is varied and the differential amplifying operation can not correctly be carried out.

SUMMARY OF THE INVENTION

It is therefore an object of this invention to provide a differential amplifier circuit capable of correctly carrying out a differential amplifying operation. Transfer gates are inserted to differential input signal lines. By controlling conductive/interrupted states of the transfer gates, the differential amplifier circuit can correctly perform differential amplification. Preferably, the transfer gates are inserted at positions such that floating capacitances of gates of differential input transistors are equal to each other.

Differential amplifier circuits according to this invention and a semiconductor device according to this invention are as follows:

(1) A differential amplifier circuit comprising:
a current source circuit disposed between a differential common node and a ground potential;
a first differential input circuit disposed between the differential common node and a first load circuit; and
a second differential input circuit disposed between the differential common node and the second load circuit for producing a judgment output at a judgment output node between the second differential input circuit and the second load circuit;
the first and the second differential input circuits being provided with input interruption switches disposed on input lines thereof for interrupting input signals;
the current source circuit being activated and the differential amplifier circuit being started at a first timing;
the input interruption switch being controlled to supply the input signals to the differential input circuits at a second timing different from the first timing.

(2) The differential amplifier circuit according to (1), wherein the input interruption switch is disposed at a position such that input capacitances of the first and the second differential input circuits are equal to each other.

(3) The differential amplifier circuit according to (2), wherein the current source circuit is activated and the differential amplifier circuit is started after the input signals are supplied to the first and the second differential input circuits and then the input interruption switches are interrupted.

(4) The differential amplifier circuit according to (2), wherein the current source circuit is activated and the differential amplifier circuit is started simultaneously when the input interruption switches are interrupted after the input signals are supplied to the first and the second differential input circuits.

(5) The differential amplifier circuit according to (3), wherein the judgment output node is provided with a pull-up transistor, the pull-up transistor being turned on when the input interruption switches are in a conductive state and turned off when the input interruption switches are interrupted.

(6) The differential amplifier circuit according to (3), further comprising an output interruption switch and a latch circuit in an output path of the judgment output node, the output interruption switch being in a conductive state and the latch circuit performing no latch operation when the current source circuit is activated and the differential amplifier circuit is operated, the output interruption switch being in an interrupted state and the latch circuit performing a latch operation when the current source circuit is inactivated and the differential amplifier circuit is not operated.

(7) The differential amplifier circuit according to (6), wherein the latch circuit comprises an inverter circuit disposed in the output path downstream of the output interruption switch, and a clocked inverter circuit loop-connected to the inverter circuit.

(8) The differential amplifier circuit according to (7), wherein the clocked inverter circuit is supplied with a control signal supplied to the output interruption switch, the clocked inverter circuit being put into a high-impedance state when the output interruption switch is conductive, the clocked inverter circuit operating as an inverter circuit when the output interruption switch is interrupted.

(9) The differential amplifier circuit according to (2), wherein, after the current source circuit is activated and the differential amplifier circuit is started, the input interruption switch is turned conductive and the input signal is supplied to the first and the second differential input circuits.

(10) The differential amplifier circuit according to (9), wherein the judgment output node is provided with a pull-up transistor, the pull-up transistor being turned on when the input interruption switch is interrupted and turned off when the input interruption switch is conductive.

(11) The differential amplifier circuit according to (9), further comprising an output interruption switch and a latch circuit disposed in an output path of the judgment output node, the output interruption switch being conductive and the latch circuit performing no latch operation when the input interruption switch is conductive, the output interruption switch being interrupted and the latch circuit performing a latch operation when the input interruption switch is interrupted.

(12) The differential amplifier circuit according to (11), wherein the latch circuit comprises an inverter circuit disposed in an output path downstream of the output interruption switch, and a clocked inverter circuit loop-connected to the inverter circuit.

(13) The differential amplifier circuit according to (12), wherein the clocked inverter circuit is supplied with a control signal supplied to the output interruption switch and is put into a high-impedance state when the output interruption switch is conductive and is operated as an inverter circuit when the output interruption switch is interrupted.

(14) The differential amplifier circuit according to (3) or (9), wherein the input signals are complementary signals.

(15) The differential amplifier circuit according to (3) or (9), wherein one of the input signals is a reference potential.

(16) The differential amplifier circuit according to (3) or (9), wherein each of the first and the second differential input circuits is an N-channel transistor, the first and the second differential input circuits having drains, sources, and gates connected to the first and the second load circuits, the differential common node, and first and second input nodes, respectively.

(17) The differential amplifier circuit according to (3) or (9), wherein the first and the second load circuits are current mirror circuits having gates connected in common.

(18) The differential amplifier circuit according to (3) or (9), wherein each of the first and the second load circuits is a resistance.

(19) The differential amplifier circuit according to (3) or (9), wherein the first and the second load circuits are P-channel transistors cross-coupled so that a gate of each of the transistors is supplied with a drain node of the other.

(20) A semiconductor device comprising a differential amplifier circuit claimed in any one of claims 1 to 13.

In the differential amplifier circuit according to this invention, the input transfer gates are inserted to the input signal lines supplied with the input signals. By controlling conductive/interrupted states of the input transfer gates, the signal input timing is adjusted. By controlling the signal input timing and the timing of starting the differential amplifier circuit, it is possible to suppress an influence of potential variation of the input signals at the start of differential amplification. Thus, the differential amplifier circuit is suppressed in influence of the potential variation of the input signals and can correctly carry out differential amplification.

DESCRIPTION OF THE PREFERRED EMBODIMENTS

Figure 1:
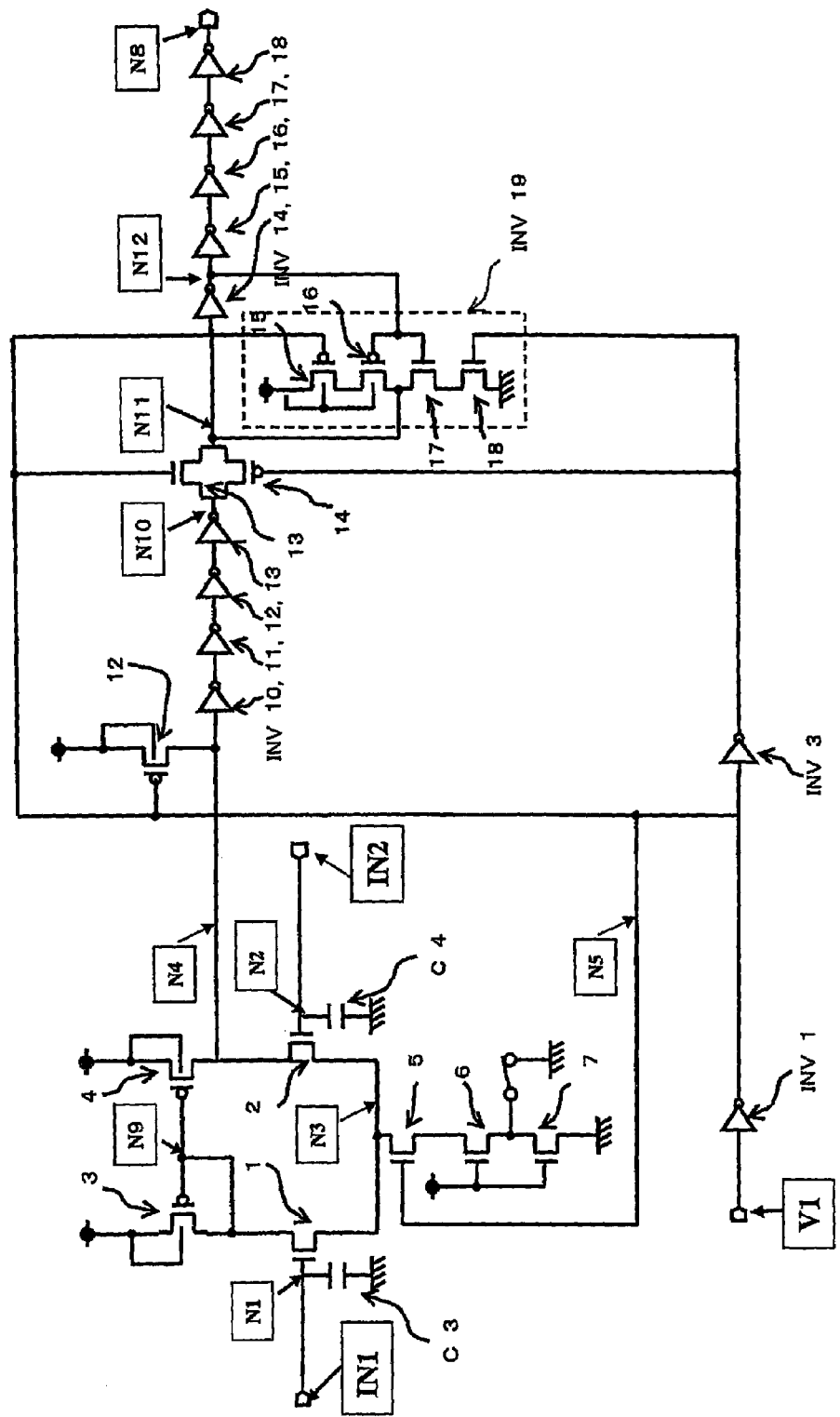
FIG. 1 is a circuit diagram of an existing differential amplifier circuit.

Now, embodiments of this invention will be described with reference to the drawing.

First Embodiment

Figure 2:
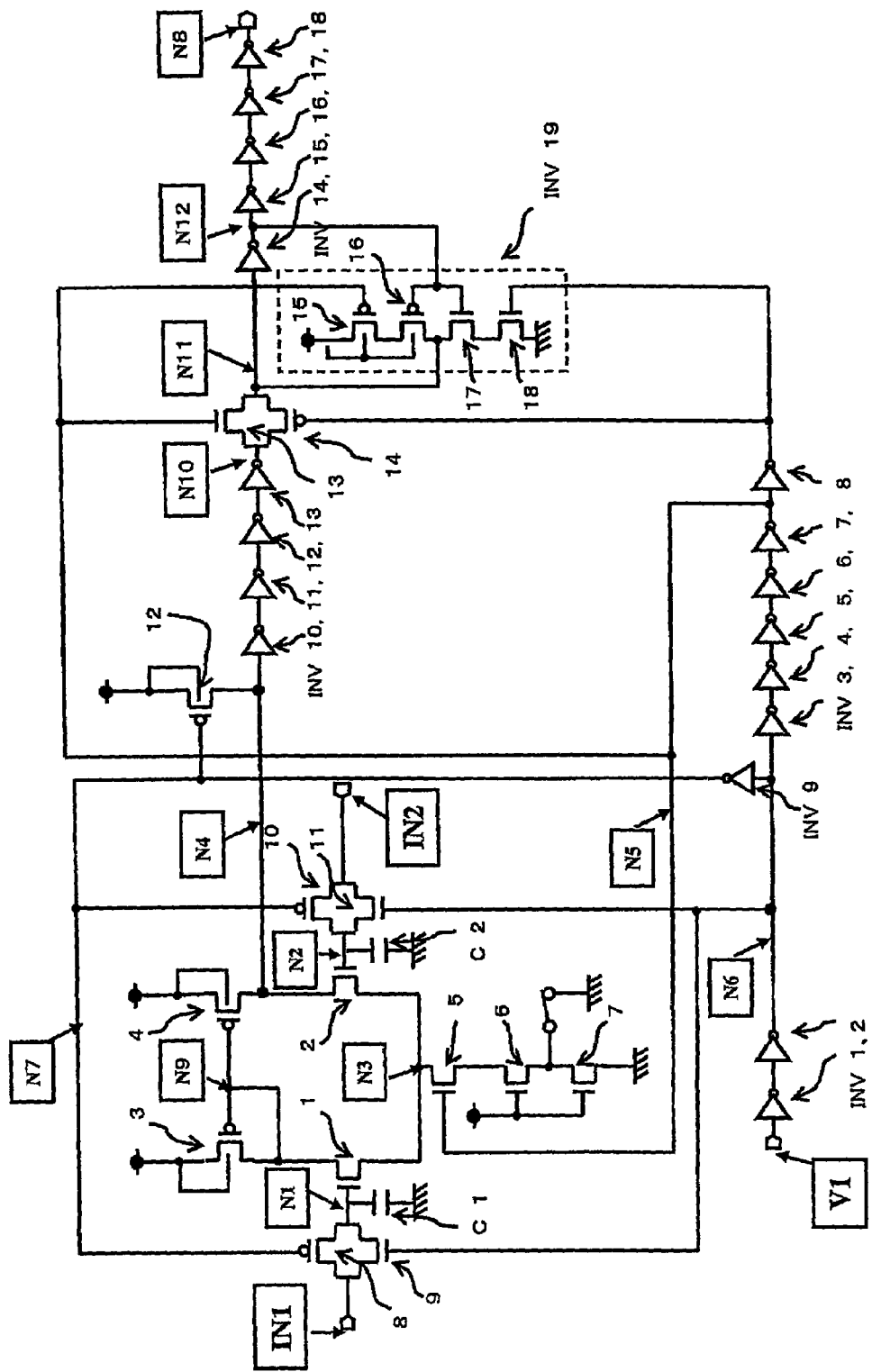
FIG. 2 is a circuit diagram of a differential amplifier circuit according to a first embodiment of this invention.
Figure 3:
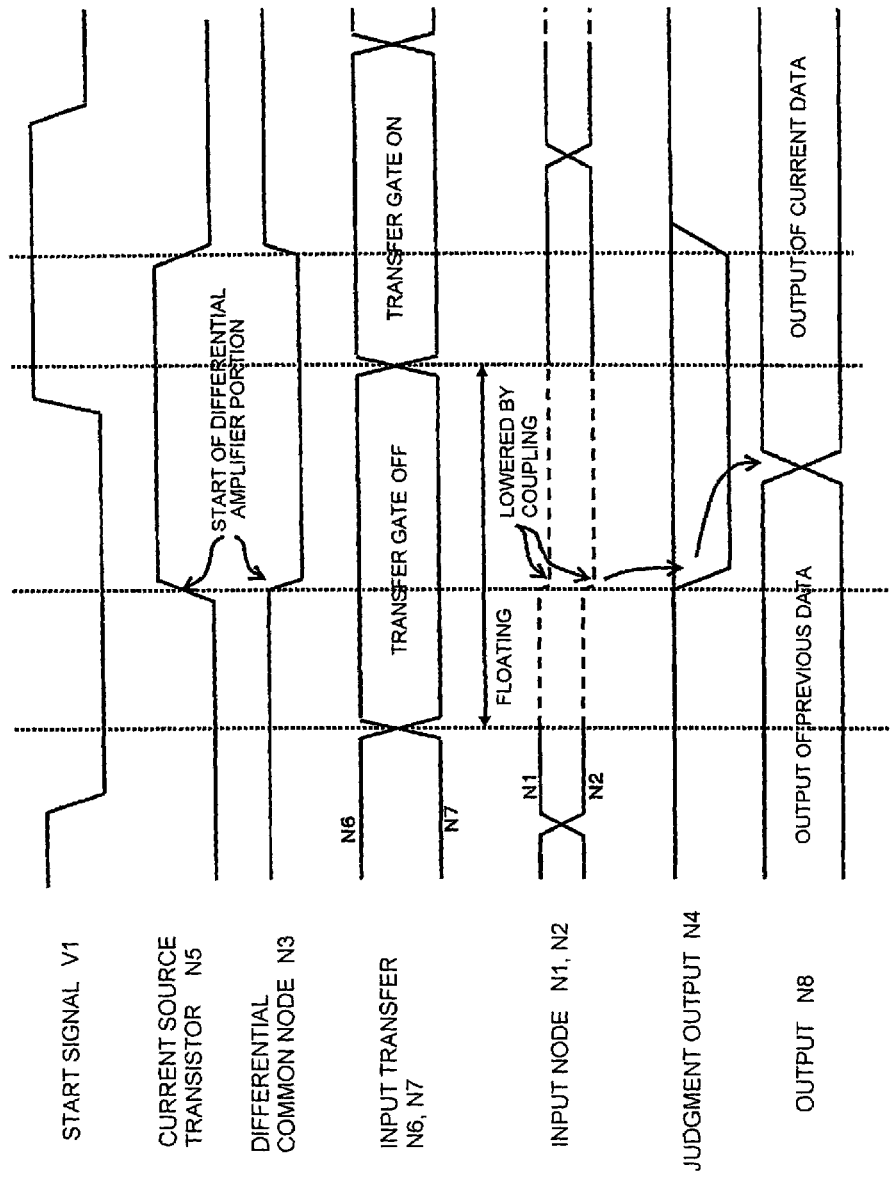
FIG. 3 is a timing chart in the first embodiment.

Referring to FIGS. 2 and 3, a first embodiment of this invention will be described. In this embodiment, after input signals are supplied, input transfer gates are interrupted and input nodes are put into a floating state. Then, a differential amplifier circuit is started.

The differential amplifier circuit comprises differential input transistors 1 and 2, current mirror transistors 3 and 4, current source transistors 5, 6, and 7, input transfer gate transistors 8 and 9, input transfer gate transistors 10 and 11, a pull-up transistor 12, output transfer gate transistors 13 and 14, clocked inverter circuit transistors 15, 16, 17, and 18, and a plurality of inverter circuits.

The differential input transistor 1 has a drain, a source, and a gate connected to a node N9, a differential common node N3, and an input node N1, respectively. The differential input transistor 2 has a drain, a source, and a gate connected to a judgment output node N4, the differential common node N3, and an input node N2, respectively. The differential input transistors 1 and 2 compare potentials of the input nodes N1 and N2 and produce a result of judgment through the judgment output node N4. The current mirror transistor 3 as a load circuit has a drain, a source, and a gate connected to the node N9, a power supply potential, and the node N9, respectively. The current mirror transistor 4 has a drain, a source, and a gate connected to the judgment output node N4, the power supply potential, and the node N9, respectively. The gates of the current mirror transistors 3 and 4 are connected to the drain of the differential input transistor 1 to form the node N9. The drains of the current mirror transistor 4 and the differential input transistor 2 are connected in common to form the judgment output node N4.

The current source transistor 5 has a drain, a source, and a gate connected to the differential common node N3, a drain of the current source transistor 6, and a node N5, respectively. The current source transistor 6 has the drain, a source, and a gate connected to the source of the current source transistor 5, a drain of the current source transistor 7, and the power supply potential, respectively. The current source transistor 7 has the drain, a source, and a gate connected to the source of the current source transistor 6, a ground potential, and the power supply potential, respectively. The current source transistor 5 is controlled by a signal of the node N5 obtained by inverting a start signal V1. The differential common node N3 is given a low potential so that the differential amplifier circuit is operated. The current source transistor 7 may be omitted. In this case, the source of the current source transistor 6 is given the ground potential. For example, if this invention is applied to a synchronous DRAM (SDRAM), the start signal V1 may be produced by delaying and adjusting an internal clock generated in synchronism with an external input clock. For example, an output signal from a phase adjusting circuit (DLL or PLL) may be delayed and adjusted to be used as the start signal V1.

The input transfer gate transistor 8 has a source, a drain, and a gate connected to an input signal terminal IN1, the input node N1, and a node N7, respectively. The input transfer gate transistor 9 has a drain, a source, and a gate connected to the input signal terminal IN1, the input node N1, and a node N6, respectively. The input transfer gate transistor 10 has a source, a drain, and a gate connected to an input signal terminal IN2, the input node N2, and the node N7, respectively. The input transfer gate transistor 11 has a drain, a source, and a gate connected to the input signal terminal IN2, the input node N2, and the node N6, respectively. These input transfer gate transistors are disposed at positions such that floating capacitances C1 and C2 of the input nodes N1 and N2 between the gates of the differential input transistors and the input transfer gate transistors are substantially equal to each other.

When a differential amplifying operation is started, a potential of the differential common node N3 is lowered and potentials at the input nodes N1 and N2 are also lowered therealong. The capacitances C1 and C2 are set to be substantially equal to each other so that a difference in lowering amount falls within a range such that no adverse influence is given to the differential amplifying operation. Thus, the capacitances C1 and C2 need not be completely equal to each other. By making the capacitance values of the input nodes N1 and N2 be substantially equal to each other, potential changes of the input nodes N1 and N2 are equalized so that the differential amplifying operation is correctly carried out. Normally, the wiring lengths from the input signal terminals IN1 and IN2 are different and the capacitance values are different. In this case, when the input signals are supplied, the potential changes of the input nodes N1 and N2 are different so that the "H" level may significantly be lowered below the "L" level of the input node on the opposite side. However, if the input transfer gates are inserted to interrupt transfer of the input signal, the capacitance values C1 and C2 are substantially equal to each other so that potential changes at the input nodes N1 and N2 are equal to each other. It is therefore possible to prevent inversion of the potential levels.

The pull-up transistor 12 has a drain, a source, and a gate connected to the judgment output node N4, the power supply potential, and the node N7, respectively, and, when the differential amplifying operation is not performed, pulls up the judgment output node N4. The output transfer gate transistor 13 has a drain, a source, and a gate connected to a node N10, a node N11, and the node N5, respectively. The output transfer gate transistor 14 has a source, a drain, and a gate connected to the node N10, the node N11, and an output obtained by inverting the node N5 by an inverter circuit INV8, respectively. During the differential amplifying operation, a signal sent from the judgment output node N4 through the inverter circuits is delivered to the node N11. When the differential amplifying operation is not carried out, the output transfer gate transistors 13 and 14 are put into an interrupted state to interrupt the signal from the judgment output node N4.

The clocked inverter circuit transistors 15, 16, 17, and 18 form a clocked inverter circuit INV19 and loop-connected to one inverter INV14 in an output path to form an output latch circuit. The output latch circuit latches data of the nodes N11 and N12. The clocked inverter circuit transistor 15 has a drain, a source, and a gate connected to a source of the clocked inverter circuit transistor 16, the power supply potential, and the node N5, respectively. The clocked inverter circuit transistor 16 has a drain, the source, and a gate connected to the node N11, the drain of the clocked inverter circuit transistor 15, and the node N12, respectively. The clocked inverter circuit transistor 17 has a drain, a source, and a gate connected to the node N11, a drain of the clocked inverter circuit transistor 18, and the node N12, respectively. The clocked inverter circuit transistor 18 has the drain, a source, and a gate connected to the source of the clocked inverter circuit transistor 17, the ground potential, and an inverted signal of the node N5, respectively. During the differential amplifying operation, the clocked inverter circuit transistors 15 and 16 are in an off state and the output latch circuit does not perform a latch operation but delivers data from the inverter circuit INV14. When the differential amplifying operation is not carried out, the clocked inverter circuit INV19 supplied with an output from the inverter circuit INV14 supplies the output to the inverter circuit INV14 to form the output latch circuit and to perform the latch operation.

The inverter circuits invert a signal supplied thereto to produce a control signal. By connecting a plurality of stages, the control signal is delayed to control an operation timing. The inverter circuits INV1 and INV2 buffer the start signal V1 and supplies the start signal V1 through the node N6 to the gates of the input transfer gate transistors 9 and 11. The inverter circuit INV9 inverts the potential at the node N6 to provide the node N7 which is supplied to the gates of the input transfer gate transistors 8 and 10 and the gate of the pull-up transistor 12.

The inverter circuits INV3, INV4, INV5, INV6, and INV7 invert the potential of the node N6 to provide the node N5 supplied to the gate of the output transfer gate transistor 13 and the gate of the clocked inverter circuit transistor 15. The inverter circuits INV10, INV11, INV12, and INV13 connected in a plurality of stages delay the potential of the judgment output node N4 to provide the node N1 supplied to the output transfer gate. The delay time is a time for setting conduction or interruption of the output transfer gate before the signal of the judgment output node N4 is transmitted.

The inverter circuit INV14 is supplied with the node N11 as an input and produces the node N12 as an output. When the differential amplifying operation is carried out, the inverter circuit INV14 forms the output latch circuit in combination with the clocked inverter circuit INV19 to latch output data. The inverter circuits INV15, INV16, INV17, and INV18 connected in a plurality of stages delay the potential of the node N12 and deliver the potential to the output terminal N8. The structure and the number of stages of these inverter circuits are not specifically limited but may be determined as desired as far as a signal level and an operation timing of the control signal are assured. These inverter circuits can be formed by freely combining logical circuits.

Referring to FIG. 3, description will be made of an operation of the differential amplifier circuit. In this embodiment, after the input signals are supplied, the input transfer gates are interrupted and the input nodes are put into a floating state. Then, the differential amplifier circuit is started.

When the differential amplifier circuit is in a standby state, the start signal has a "H" level, the potential of the node N5 has a "L" level, the potential of the node N6 has a "H" level, and the potential of the node N7 has a "L" level. The current source transistor 5 is in an off state and the differential amplification is inactive. The input transfer gates are in a conductive state and the input signals IN1 and IN2 can be transmitted to the input nodes N1 and N2. The pull-up transistor 12 is turned on and the judgment output node N4 has a "H" level. The output transfer gate is in an interrupted state and the output latch circuit is in a latched state and produces previous data as an output.

After the input signals IN1 and IN2 are supplied to the input nodes N1 and N2, the start signal V1 is changed from a "H" level into a "L" level. Herein, the input signals IN1 and IN2 are complementary signals. The start signal V1 is delayed by the inverter circuits INV1 and INV2. The node N6 is turned into a "L" level. The potential of the node N6 is further Inverted by the inverter circuit INV9 and the node N7 is changed into a "H" level. When the node N6 is turned into a "L" level and the node N7 is turned into a "H" level, the input transfer gates are put into an interrupted state. The pull-up transistor 12 is turned off and stops pull-up of the judgment output node N4. The judgment output node N4 is put into a floating state but its potential is maintained. The input transfer gates are interrupted and the input nodes N1 and N2 are put into a floating state but maintain the potentials of the input signal terminals IN1 and IN2.

The potential of the node N6 is delayed and inverted by the inverter circuits INV3 to INV7 and the node N5 is changed into a "H" level. When the node N5 is turned into a "H" level, the current source transistor 5 is turned on and the differential common node N3 has a low potential so that the differential amplifying operation is started. When the differential common node N3 is changed into a low potential, the potentials of the input nodes N1 and N2 are lowered, drawn by a coupling capacitance generated between the sources and the gates of the differential input transistors 1 and 2. However, since the floating capacitances C1 and C2 from the input transfer gates to the gates of the differential input transistors are substantially equal to each other, the lowering amounts of potentials are equal to each other so that the potential difference is maintained. Further, since the node N5 has a "H" level, the output transfer gate transistor 13 is turned on and the clocked inverter circuit transistor 15 is turned off. Herein, a time lag is provided between a timing of interrupting the input transfer gates and a timing of starting the differential amplification. However, because a response speed of the input transfer gates is higher than a response speed of the differential common node, the input timings may be substantially same.

The potential at the node N5 is inverted by the inverter circuit INV8 to be turned into a "L" level. The output transfer gate transistor 14 is turned on so that the output transfer gate becomes completely conductive. The transistor 18 of the clocked inverter circuit INV19 is turned off and the clocked inverter circuit INV19 is put into a high-impedance state. Loop connection with the inverter circuit INV14 is interrupted. The output latch circuit is inactivated.

When the differential common node N3 is changed into a low potential, the potentials at the input nodes are lowered by coupling. However, since the capacitance values of the capacitances C1 and C2 of the input nodes N1 and N2 are set to be equal to each other, the potential difference between the varying potentials is unchanged. Therefore, the result of comparison and judgment of input node potentials is correct. The result of comparison and judgment of the input node potentials is delivered to the judgment output node N4, passes through the inverter circuits INV10, INV11, INV12, and INV13, and is transmitted to the output transfer gate. The output transfer gate is in a conductive state. The result of comparison and judgment further passes through the inverter circuits INV14, INV15, INV16, INV17, and INV18 and is transmitted to the output terminal N8. Thus, the differential amplifying operation is completed.

The start signal V1 is changed from a "L" level into a "H" level. The nodes N6 and N7 supplied to the input transfer gates are turned into a "H" level and a "L" level, respectively, so that the input transfer gates are put into a conductive state. The node N5 is turned into a "L" level so that the transistor 5 is turned off and the differential amplification is inactive. The judgment output node N4 is turned into a "H" level by the pull-up transistor 12. On the other hand, the output transfer gate is interrupted and, therefore, the "H" level of the inactive state is not transmitted to the output side.

When the transistor 15 has a gate input of a "L" level and the transistor 18 has a gate input of a "H" level, the clocked inverter circuit INV19 forms an inverter circuit and forms, in combination with the inverter circuit INV14, the latch circuit. As the output transfer gate is in an interrupted state, the "H" level of the inactive state is not transmitted to the output side. The latch circuit latches the judgment result of a previous differential amplifying operation and the output terminal N8 continuously produces the judgment result of the previous differential amplifying operation. Herein, the inverter circuits INV10 to INV13 are a delay circuit for preventing the "H" level of the judgment output node N4 from being transmitted before the output transfer gate is interrupted.

In this embodiment, the complementary signals are used as the differential input signals. Alternatively, a reference potential (Vref) may be used as one of the input signals. The timing of starting the differential amplifying operation and the timing of interrupting the input transfer gates may be substantially same. The input timing of the input signals has a large degree of freedom because the input signals can be supplied as far as the differential amplification is inactive and the input transfer gates are in a conductive state. Further, a load circuit of a differential amplifier portion is not limited to the current mirror type but may be of a resistance type or cross-coupled transistors in which each of input transistors of a differential pair has a gate supplied with a drain of the other input transistor. Thus, the differential amplifier circuit according to this invention has a high degree of freedom and is applicable to various circuits. For example, the differential amplifier circuit according to this invention is applicable to an amplifier circuit of a small signal amplitude, such as an intermediate amplifier of a semiconductor memory or a sense amplifier of a static random access memory.

In the differential amplifier circuit according to this embodiment, the transfer gates are inserted to input signal wirings at positions such that the floating capacitance values of the differential input nodes are equal to each other, respectively. After the input signals are supplied, the transfer gates are interrupted and the differential amplifying operation is performed. At the start of the differential amplifying operation, the differential common node of a differential amplification input portion is lowered to a low potential and the input node potentials are lowered also. However, the amounts of potential change at these input nodes are equal to each other so that the differential amplifying operation is correctly carried out.

Second Embodiment

Figure 4:
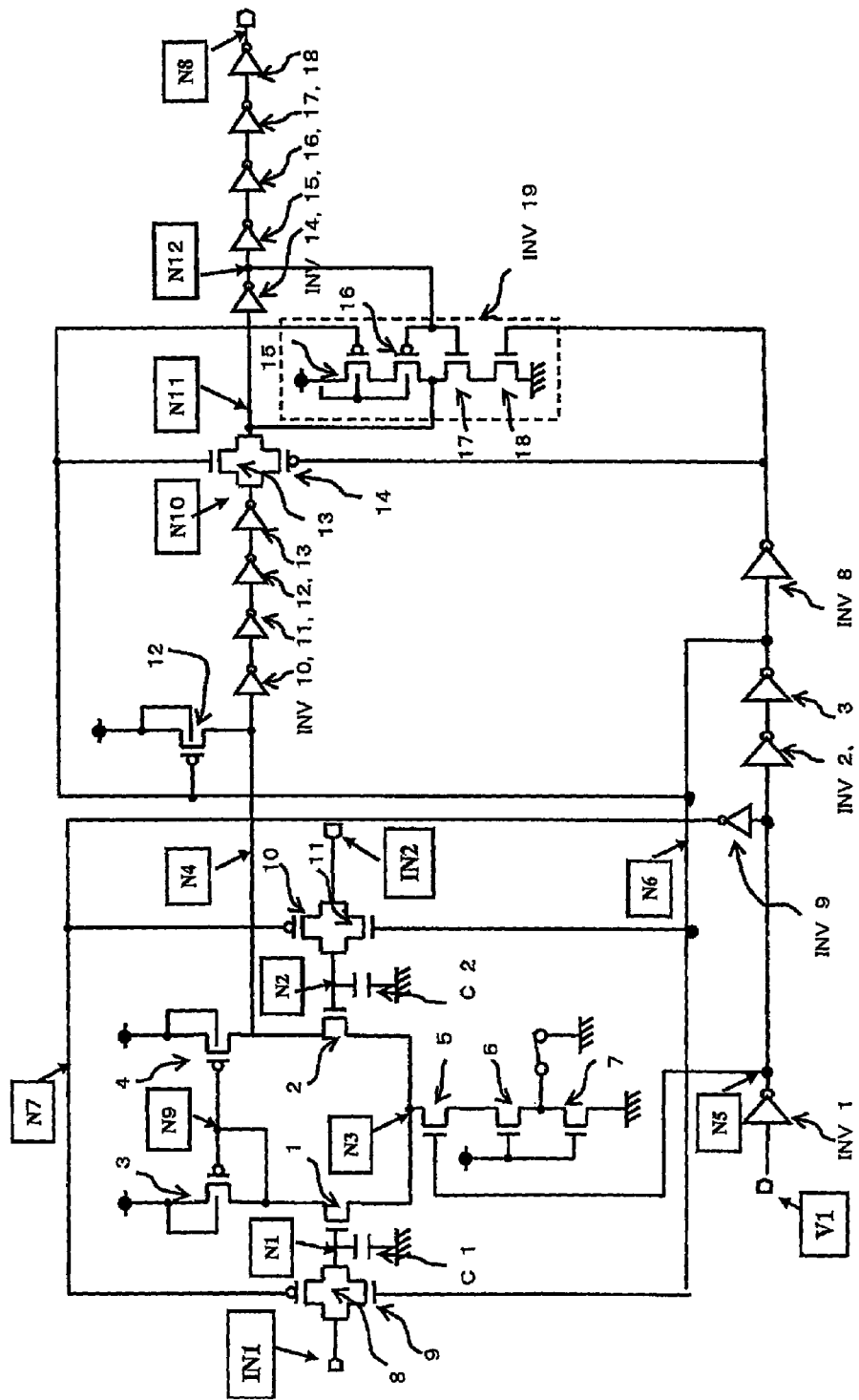
FIG. 4 is a circuit diagram of a differential amplifier circuit according to a second embodiment of this invention.
Figure 5:
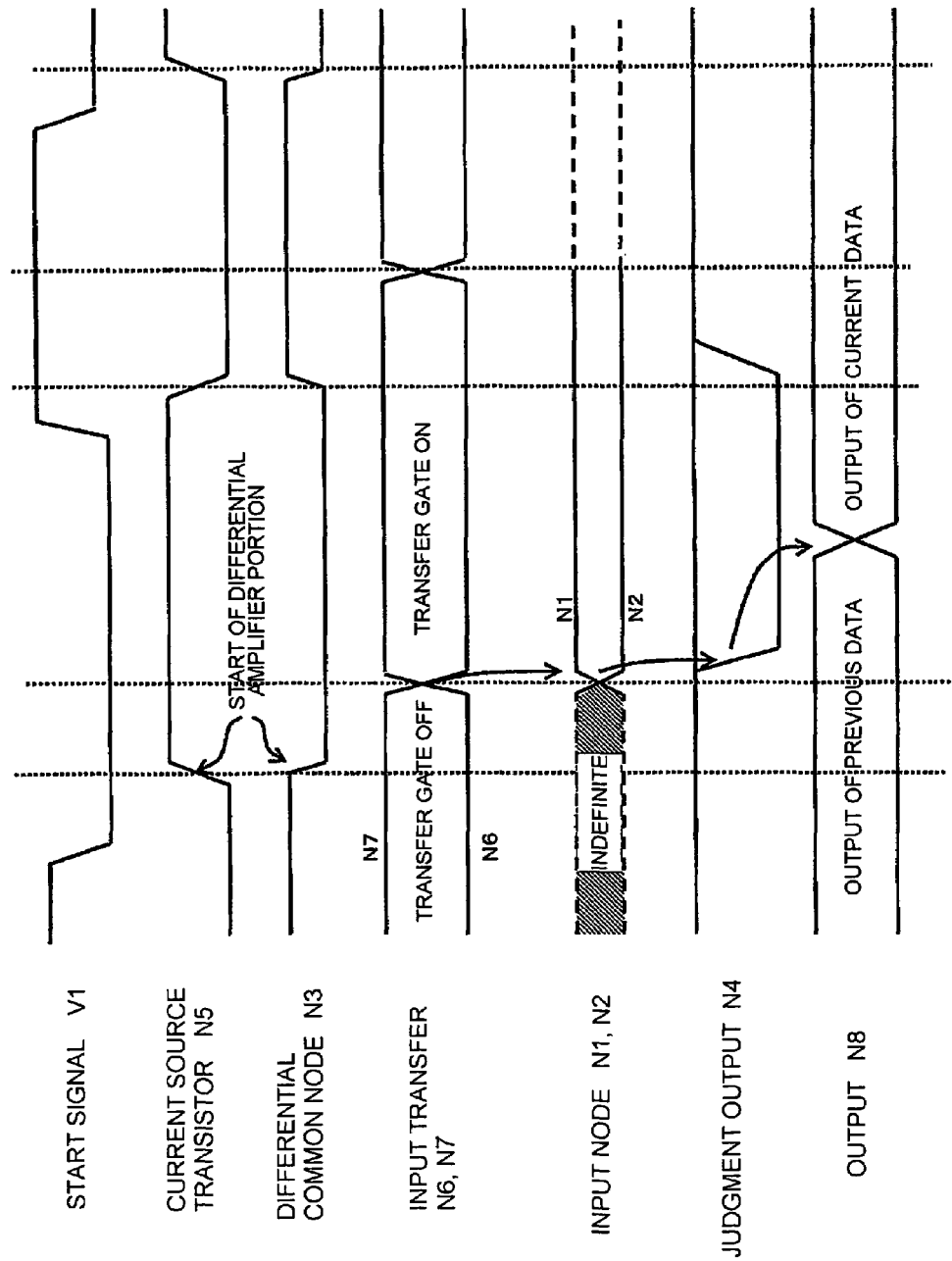
FIG. 5 is a timing chart in the second embodiment.

Referring to FIGS. 4 and 5, description will be made of a second embodiment of this invention. In this embodiment, after a differential amplifier circuit is started while input transfer gates are in an interrupted state, the input transfer gates are turned into a conductive state and input signals are supplied.

The differential amplifier circuit according to the second embodiment and illustrated in FIG. 4 is similar in basic structure to that of the first embodiment (FIG. 2). However, a signal supplied to each node and the timing of generating the signal are different. Therefore, similar parts are designated by like reference numerals and detailed description thereof will be omitted. Hereinafter, description will be made of signals produced by a plurality of inverter circuits and timings of generating the signals.

The differential amplifier circuit comprises differential input transistors 1 and 2, current mirror transistors 3 and 4, current source transistors 5, 6, and 7, input transfer gate transistors 8 and 9, input transfer gate transistors 10 and 11, a pull-up transistor 12, output transfer gate transistors 13 and 14, clocked inverter circuit transistors 15, 16, 17, and 18, and a plurality of inverter circuits.

A node N5 obtained by inverting a start signal V1 by the inverter circuit INV1 is supplied to a gate of the current source transistor 5. A node N7 obtained by inverting a potential of the node N5 by the inverter circuit INV9 is supplied to gates of the input transfer gate transistors 8 and 10. A node N6 obtained by delaying the potential of the node N5 by the inverter circuits INV2 and INV3 is supplied to gates of the input transfer gate transistors 9 and 11, a gate of the pull-up transistor 12, a gate of the output transfer gate transistor 13, and a gate of the transistor 15 of the clocked inverter circuit INV19. Further, the potential of the node N6 is inverted by the inverter circuit INV8 and supplied to a gate of the output transfer gate transistor 14 and a gate of the transistor 18 of the clocked inverter circuit INV19.

Referring to FIG. 5, description will be made of an operation of the differential amplifier circuit according to this embodiment. When the differential amplifier circuit is in a standby state, the start signal has a "H" level, the potential of the node N5 has a "L" level, the potential of the node N6 has a "L" level, and the potential of the node N7 has a "H" level. The current source transistor 5 is in an off state and the differential amplification is inactive. The input transfer gates are in an interrupted state. Input nodes N1 and N2 are in a floating state and hold signal levels of previous data or of indefinite values. In the figure, it is assumed that the previous data are lost and the input nodes N1 and N2 are in an indefinite state of a low potential. In this case, the differential input transistors are in an off state. By an on current of the pull-up transistor 12, a judgment output node N4 has a "H" level. An output transfer gate is in an interrupted state and an output latch circuit is in a latched state and produces the previous data as an output.

The start signal V1 is changed from a "H" level into a "L" level. The start signal V1 is inverted by the inverter circuit INV1 and the node N5 is turned into a "H" level. The node N5 has a "H" level and the current source transistor 5 is turned on. The differential amplifier circuit is started. The input nodes N1 and N2 are in an indefinite state of a low potential. The differential input transistors are turned off. By an on current of the pull-up transistor 12, the judgment output node N4 is kept at a "H" level. Then, the potential of the node N7 is changed into a "L" level and the potential of the node N6 is changed into a "H" level. As a consequence, the input transfer gates are turned into a conductive state. The pull-up transistor 12 is turned off and stops pull-up of the judgment output node N4. The input transfer gates are put into a conductive state and the input nodes N1 and N2 are supplied with the potentials of the input signals IN1 and IN2.

The potential of the node N6 turns on the output transfer gate transistor 13 and turns off the transistor 15 of the clocked inverter circuit INV19. Further, the potential of the node N6 is inverted by the inverter circuit INV8 into a "L" level and turns on the output transfer gate transistor 14 and turns off the transistor 18 of the clocked inverter circuit INV19. The output transfer gate is put into a completely conductive state. Further, the clocked inverter circuit INV19 is put into a high-impedance state and loop-connection with the inverter circuit INV14 is interrupted. The output latch circuit is inactivated.

When the input signals IN1 and IN2 are supplied, the differential amplifier circuit is started. Since the differential common node N3 has a low potential, the result of comparison and judgment of the input node potentials is correct. The result of comparison and judgment of the input node potentials is delivered to the judgment output node N4, passes through the inverter circuits INV10, INV11, INV12, and INV13, and is transmitted to the output transfer gate. The output transfer gate is in a conductive state. The result of comparison and judgment further passes through the inverter circuits INV14, INV15, INV16, INV17, and INV18 and is transmitted to the output terminal N8. Thus, the differential amplifying operation is completed.

In the second embodiment, insert positions of the input transfer gates are not specifically limited because the input signals are supplied after the differential amplifier circuit is started. The input transfer gates are inserted between the input signal terminals IN1 and IN2 and gate electrodes of the differential input transistors 1 and 2. Preferably, however, the input transfer gates are disposed near the gate electrodes of the differential input transistors 1 and 2. By disposing the input transfer gates in the vicinity of the gate electrodes of the differential input transistors, the capacitances C1 and C2 become small. Because the capacitances are small, input small signals can be supplied with a stable waveform.

The start signal V1 is changed from a "L" level into a "H" level. The node N5 is turned into a "L" level so that the current source transistor 5 is turned off and the differential amplification becomes inactive. Then, the node N6 is turned into a "L" level and the node N7 is turned into a "H" level. The input transfer gates are turned into an interrupted state. The input nodes N1 and N2 are put into a floating state but maintain the potentials in a short period of time. However, as the time elapses, electric charges are lost and the potentials become indefinite. However, the differential amplification is inactive and the judgment output node N4 is turned into a "H" level by the pull-up transistor 12. On the other hand, the output transfer gate is interrupted and the "H" level of the inactive state is not transmitted to the output side.

In the clocked inverter circuit INV19, the gate input of the transistor 15 has a "L" level and the gate input of the transistor 18 has a "H" level. Therefore, the inverter circuit INV19 forms a latch circuit in combination with the inverter circuit INV14. By latching the judgment result of the differential amplifying operation, the output terminal N8 continuously produces the judgment result of the differential amplifying operation. Herein, the inverter circuits INV10 to INV13 are a delay circuit for preventing the "H" level of the judgment output node N4 in the inactive state from being transmitted before the output transfer gate is interrupted.

Figure 6:
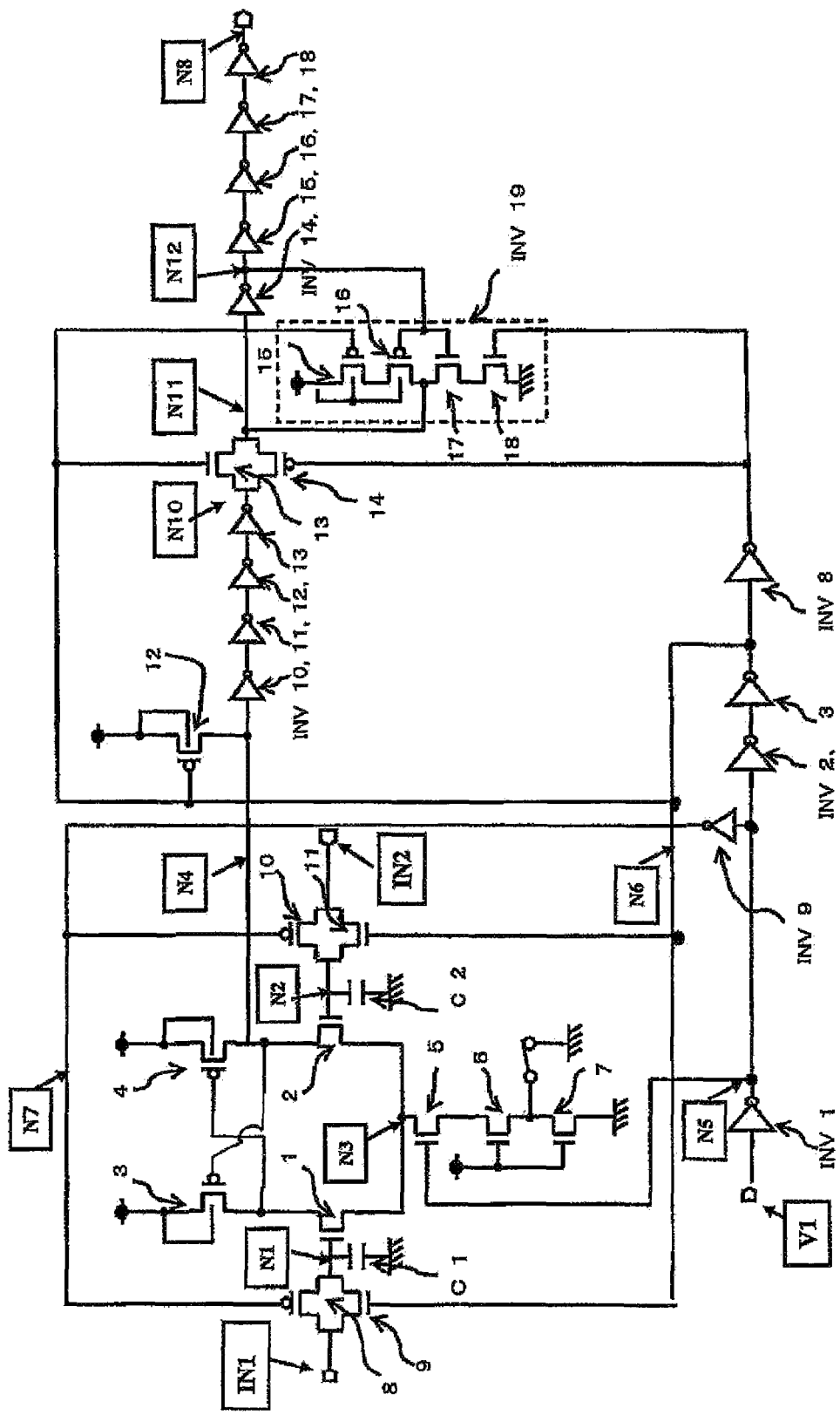
FIG. 6 is a circuit diagram of a differential amplifier circuit according to a further embodiment of the invention.

In this embodiment, the complementary signals are used as the differential input signals. Alternatively, a reference potential (Vref) may be used as one of the input signals. The timing of switching the input signals IN1 and IN2 has a large degree of freedom because the input signals can be supplied as far as the input transfer gates are in an inactive state. Further, a load circuit of a differential amplifier portion is not limited to the current mirror type but may be of a resistance type or cross-coupled transistors in which each of input transistors of a differential pair has a gate supplied with a drain of the other input transistor (see, for example, FIG. 6). Thus, the differential amplifier circuit according to this invention has a high degree of freedom and is applicable to various circuits. For example, the differential amplifier circuit according to this invention is applicable to an amplifier circuit of a small signal amplitude, such as an intermediate amplifier of a semiconductor memory or a sense amplifier of a static random access memory.

In the differential amplifier circuit according to this embodiment, the input transfer gates are inserted into the input signal wirings from the input signal terminals to the gate electrodes of the differential input transistors. After the differential amplifier circuit is started, the input transfer gates are turned into a conductive state and the input signals are supplied so that the differential amplifying operation is carried out. After the differential amplification is activated and the potential of the differential common node is lowered, the input signals are supplied. Thus, the differential amplifying operation is correctly carried out.

Although this invention has been described in conjunction with the preferred embodiments thereof, this invention may be modified in various other manners within the scope of the appended claims. For example, the clocked inverter comprising the transistors 15, 16, 17, and 18 may be replaced by an ordinary inverter comprising the transistors 16 and 17 with the transistors 15 and 18 connected in parallel to an output portion of the inverter as a transfer gate type switch. In this case, one end of the switch is used as an output. As the signals supplied to the gate terminals, the signals supplied to the transistors 15, 16, 17, and 18 of the clocked inverter are directly connected thereto.

What is claimed is:

1. A differential amplifier circuit comprising:
    a current source circuit disposed between a differential common node and a ground potential;
    a first differential input circuit disposed between the differential common node and a first load circuit; and
    a second differential input circuit disposed between the differential common node and the second load circuit for producing a judgment output at a judgment output node between the second differential input circuit and the second load circuit;
    the first and the second differential input circuits being provided with input interruption switches disposed on input lines thereof for interrupting input signals;
    the current source circuit being activated and the differential amplifier circuit being started at a first timing;
    the input interruption switches being controlled to supply the input signals to the differential input circuits at a second timing following the first timing,
    wherein, after and while the current source circuit is activated and the differential amplifier circuit is started, the input interruption switches are turned conductive and the input signals are supplied to the first and the second differential input circuits.

2. The differential amplifier circuit according to claim 1, wherein the input interruption switches are disposed at positions such that input capacitances of the first and the second differential input circuits are equal to each other.

3. The differential amplifier circuit according to claim 1, wherein the judgment output node is provided with a pull-up transistor, the pull-up transistor being turned on when the input interruption switches are interrupted and turned off when the input interruption switches are conductive.

4. The differential amplifier circuit according to claim 1, further comprising an output interruption switch and a latch circuit disposed in an output path of the judgment output node, the output interruption switch being conductive and the latch circuit performing no latch operation when the input interruption switches are conductive, the output interruption switch being interrupted and the latch circuit performing a latch operation when the input interruption switches are interrupted.

5. The differential amplifier circuit according to claim 4, wherein the latch circuit comprises an inverter circuit disposed in an output path downstream of the output interruption switch, and a clocked inverter circuit loop-connected to the inverter circuit.

6. The differential amplifier circuit according to claim 5, wherein the clocked inverter circuit is supplied with a control signal supplied to the output interruption switch and is put into a high-impedance state when the output interruption switch is conductive and is operated as an inverter circuit when the output interruption switch is interrupted.

7. The differential amplifier circuit according to claim 1, wherein the input signals are complementary signals.

8. The differential amplifier circuit according to claim 1, wherein one of the input signals is a reference potential.

9. The differential amplifier circuit according to claim 1, wherein each of the first and the second differential input circuits is an N-channel transistor, the first and the second differential input circuits having drains, sources, and gates connected to the first and the second load circuits, the differential common node, and first and second input nodes, respectively.

10. The differential amplifier circuit according to claim 1, wherein the first and the second load circuits are current mirror circuits having gates connected in common.

11. The differential amplifier circuit according to claim 1, wherein each of the first and the second load circuits is a resistance.

12. The differential amplifier circuit according to claim 1, wherein the first and the second load circuits are P-channel transistors cross-coupled so that a gate of each of the transistors is coupled with a drain of the other.

13. A semiconductor device comprising a differential amplifier circuit claimed in any one of claims 1-2 or 3-6.

* * * * *